(12) United States Patent
Kamikubo (10) Patent No.: US 8,835,881 B2
(45) Date of Patent: Sep. 16, 2014

(54) DRIFT CORRECTION METHOD AND PATTERN WRITING DATA GENERATION METHOD

(71) Applicant: NuFlare Technology, Inc., Numazu (JP)

(72) Inventor: Takashi Kamikubo, Tokyo (JP)

(73) Assignee: NuFlare Technology, Inc., Numazu-shi (JP)

( * ) Notice: Subject to any disclaimer, the term of this patent is extended or adjusted under 35 U.S.C. 154(b) by 0 days.

(21) Appl. No.: 13/914,772

(22) Filed: Jun. 11, 2013

(65) Prior Publication Data

US 2013/0334442 A1 Dec. 19, 2013

(30) Foreign Application Priority Data

Jun. 19, 2012 (JP) ................. 2012-138003

(51) Int. Cl.
G03F 7/20 (2006.01)
G21K 5/04 (2006.01)
H01J 37/317 (2006.01)
H01J 37/304 (2006.01)
H01J 37/30 (2006.01)

(52) U.S. Cl.
CPC ......... *H01J 37/3002* (2013.01); *H01J 37/3177* (2013.01); *H01J 37/3045* (2013.01)
USPC .............. 250/492.22; 250/492.2; 250/492.23; 250/396 R; 250/492.1; 250/559.2; 430/296; 430/30

(58) Field of Classification Search
CPC .............. H01J 37/3174; H01J 37/3045; H01J 37/3002; H01J 37/3026
USPC ................ 250/492.22, 492.2, 492.23, 396 R, 250/492.1, 559.2; 430/296, 30
See application file for complete search history.

(56) References Cited

U.S. PATENT DOCUMENTS

| 5,528,048 A | * | 6/1996 | Oae et al. ................. | 250/492.22 |
| 5,614,725 A | * | 3/1997 | Oae et al. ................. | 250/492.22 |
| 5,920,077 A | * | 7/1999 | Oae et al. ................. | 250/492.22 |
| 5,962,859 A | * | 10/1999 | Groves et al. ............ | 250/492.23 |
| 5,977,548 A | * | 11/1999 | Oae et al. ................. | 250/397 |
| 5,981,962 A | * | 11/1999 | Groves et al. ............ | 250/492.23 |
| 6,118,129 A | * | 9/2000 | Oae et al. ................. | 250/492.22 |

(Continued)

FOREIGN PATENT DOCUMENTS

| JP | 7-142321 | 6/1995 |
| JP | 9-293670 | 11/1997 |
| JP | 2010-192666 | 9/2010 |

*Primary Examiner* — David A Vanore
(74) *Attorney, Agent, or Firm* — Oblon, Spivak, McClelland, Maier & Neustadt, L.L.P.

(57) ABSTRACT

A writing area of a sample is divided into a plurality of stripes having a width corresponding to an area density of a pattern to be written on the sample with a charged-particle beam. The writing is stopped when writing of at least one stripe is terminated, and a drift amount is measured. An irradiation position of the charged-particle beam is corrected with the use of the drift amount. When the average value of the area density is more than a predetermined value, a stripe has a width smaller than the reference width, and when the average value of the area density is less than the predetermined value, the stripe has a width larger than the reference width. The width of the stripe is preferably a width corresponding to the variation of a drift from the beginning of irradiation with the charged-particle beam.

18 Claims, 7 Drawing Sheets

(56) References Cited

U.S. PATENT DOCUMENTS

| | | | |
|---|---|---|---|
| 6,175,122 B1 * | 1/2001 | Groves et al. | 250/492.23 |
| 6,352,799 B1 * | 3/2002 | Nakasuji | 430/5 |
| 6,486,479 B1 * | 11/2002 | Oae et al. | 250/492.2 |
| 7,705,322 B2 * | 4/2010 | Nishimura et al. | 250/396 R |
| 8,178,856 B2 * | 5/2012 | Nakayamada et al. | 250/492.22 |
| 8,362,450 B2 * | 1/2013 | Iizuka et al. | 250/492.22 |
| 8,461,555 B2 * | 6/2013 | Kurohori | 250/492.22 |
| 8,610,096 B2 * | 12/2013 | Touya | 250/559.22 |
| 2009/0057577 A1 * | 3/2009 | Parker | 250/492.23 |
| 2010/0209833 A1 * | 8/2010 | Kurohori | 430/30 |
| 2011/0031387 A1 * | 2/2011 | Nakayamada et al. | 250/252.1 |
| 2012/0112323 A1 * | 5/2012 | Zani et al. | 257/618 |
| 2012/0193553 A1 * | 8/2012 | Touya | 250/492.22 |
| 2012/0211676 A1 * | 8/2012 | Kamikubo | 250/492.22 |
| 2013/0037724 A1 * | 2/2013 | Tsuruta | 250/397 |
| 2013/0065184 A1 * | 3/2013 | Nishimura et al. | 430/296 |
| 2013/0334442 A1 * | 12/2013 | Kamikubo | 250/492.3 |
| 2013/0335503 A1 * | 12/2013 | Muraki et al. | 347/225 |

* cited by examiner

DRIFT CORRECTION METHOD AND PATTERN WRITING DATA GENERATION METHOD

CROSS-REFERENCE TO THE RELATED APPLICATION

The entire disclosure of the Japanese Patent Application No. 2012-138003, filed on Jun. 19, 2012 including specification, claims, drawings, and summary, on which the Convention priority of the present application is based, are incorporated herein in its entirety.

FIELD OF THE INVENTION

The present invention relates to a drift correction method, and a pattern writing data generation method. More specifically, the present invention relates to a drift correction method and a pattern writing data generation method used in a charged-particle beam writing apparatus.

BACKGROUND

In the formation of a circuit pattern of a semiconductor device, a mask is used. In a process of manufacturing the mask, an electron beam lithography technique is used.

Electron beam lithography inherently provides a superior resolution, since a charged particle beam is used, more specifically an electron beam. This technology is also advantageous in that great depth of focus can be obtained, which enables dimensional variations to be reduced even when a large step feature is encountered. Moreover, an electron beam writing apparatus used for the electron beam lithography includes a system for data processing. Furthermore, this system also controls the drawing of circuit patterns, these circuit patterns can be complex and in a variety of designs.

Therefore the technology has been applied to the development of state-of-the-art devices typified by DRAM (dynamic random access memory), as well as to the production of some ASICs (application specific integrated circuits). Further effort is being made to develop an electron beam lithographic technique for writing a circuit pattern directly on a wafer with an electron beam.

The Patent Document 1 discloses a variable shape electron beam writing apparatus used for electron beam lithography.

The pattern writing data to be used in an electron beam writing apparatus is prepared using design data (CAD data) of a semiconductor integrated circuit, as one example. The data designed by a CAD system is processed in a predetermined fashion, and then divided into a plurality of stripes having the same width. The width of the stripes is a width, which can be deflected by a main deflector. Thereby the writing data of the entire chip has a hierarchical data structure including, the data of a plurality of strip-like stripes whose size corresponds to the size of the main deflection region, and the data of a plurality of sub-deflection regions, smaller in size than the main deflection region, in a single stripe.

When a pattern is written on a mask placed on a stage, while the stage is moved in a direction perpendicular to a width direction of the stripe, an electron beam is positioned in each sub deflection area. A predetermined position in the sub deflection area is irradiated with the electron beam.

When the mask placed on the stage in the electron beam writing apparatus is irradiated with the electron beam, reflected electrons are generated. The reflected electrons collide against an optical system, a detector, and so on provided in the electron beam writing apparatus and are charged up, whereby a new electric field is generated. Consequently, a direction of the electron beams deflected toward the mask is changed, and a drift in which a writing position deviates from a desired position occurs.

Although the drift is not due to only the above cause, in each case, it is required that a position of a reference mark on the stage is detected in the middle of writing to measure an amount of the drift, and the writing position is corrected so as to be located at a desired position. More specifically, the coordinates of the reference mark are obtained immediately before writing, and writing operation is then temporarily stopped during writing to obtain the coordinates of the reference mark again. Since a difference between the coordinates and the former coordinates is the drift amount, an electron beam writing position is corrected using the obtained value.

In conventional methods, the detection of the position of the reference mark in the middle of writing is performed at a predetermined time interval. More specifically, when writing of a stripe end is terminated in accordance with a previously set correction interval, the electron beam irradiation position is moved to the reference mark, and the reference mark is scanned with the electron beam to detect the position of the reference mark. In the drift correction, a value obtained by linear interpolation of a difference between the detected position and the last detected position is defined as a position variation before the start of the next detection. A permissible error after the drift correction is required to be satisfactorily smaller than positional accuracy of a mask pattern.

Recently, with high integration of a semiconductor integrated circuit, a circuit pattern is further miniaturized and complicated. Thus, higher positional accuracy of the pattern is required for the mask, and the error after the drift correction is required to be further reduced. However, when the drift correction is performed in accordance with the previously set correction interval, the number of times of measuring the drift amount is required to be increased to reduce a correction error, so that there is a problem that the entire writing time becomes longer.

Patent Literature 1: Japanese Laid-Open Patent Publication No. Hei 9-293670 (1997)

Patent Literature 2: Japanese Laid-Open Patent Publication No. Hei 7-142321 (1995)

The present invention has been made in view of the above problems. Namely, the present invention aims to provide a drift correction method, which detects a drift conventionally difficult to be detected and can improve correction accuracy, and a pattern writing data generation method suitable to be used with the drift correction method.

Other challenges and advantages of the present invention are apparent from the following description.

SUMMARY OF THE INVENTION

According to one aspect of the present invention, a drift correction method comprising, dividing a writing area of a sample into a plurality of stripes having a width corresponding to an area density of a pattern to be written on the sample with a charged-particle beam, stopping writing when at least one stripe is terminated, or during writing of one of the stripes and measuring a drift amount, and correcting an irradiation position of the charged-particle beam with the use of the drift amount.

Further to this aspect of the present invention, a drift correction method, wherein the writing area is divided into stripes having a reference width and divided into a mesh shape with a predetermined size to form a plurality of small areas, an area density of the pattern is calculated for each of the small areas, an average value of the area density of the small area included in the stripe having the reference width is obtained, and the reference width is adjusted according to the average value.

Further to this aspect of the present invention, a drift correction method, wherein when the average value of the area density is more than a predetermined value, a stripe has a width narrower than the reference width, and when the average value of the area density is less than the predetermined value, the stripe has a width wider than the reference width.

Further to this aspect of the present invention, a drift correction method, wherein after the reference width is adjusted according to the average value of the area density, the width is further adjusted according to the variation of the area density of the pattern between the stripes.

Further to this aspect of the present invention, a drift correction method, wherein the width of the stripe is a width corresponding to the variation of a drift from the beginning of irradiation with the charged-particle beam.

Further to this aspect of the present invention, a drift correction method, wherein the writing area is divided into stripes having a reference width and divided into a mesh shape with a predetermined size to form a plurality of small areas, an area density of the pattern is calculated for each of the small areas, a maximum value of the area density of the small area included in the stripe having the reference width is obtained, and the reference width is adjusted according to the maximum value.

Further to this aspect of the present invention, adrift correction method, wherein the writing area is divided into stripes having a reference width and divided into a mesh shape with a predetermined size to form a plurality of small areas, an area density of the pattern is calculated for each of the small areas, a minimum value of the area density of the small area included in the stripe having the reference width is obtained, and the reference width is adjusted according to the minimum value.

According to another aspect of the present invention, a drift correction method comprising the steps of, generating layout data from pattern data of a pattern to be written on a writing area on a sample, dividing the layout data into stripes having a reference width and dividing the layout data into a mesh shape with a predetermined size to form a plurality of small areas, calculating an area density of the pattern for each of the small areas, and obtaining an average value of the area densities of the small areas included in the stripe having the reference width, adjusting the reference width according to the average value; and writing the pattern on the sample with a charged-particle beam in accordance with adjusted stripes, wherein when the writing of at least one adjusted stripe is terminated, or during the writing of one of the adjusted stripes, writing is stopped to measure a drift amount, and an irradiation position of the charged-particle beam is corrected using the drift amount.

Further to this aspect of the present invention, a drift correction method, wherein in the step of writing the pattern with the charged-particle beam, the pattern is written while the charged-particle beam is deflected by a main deflector and a sub deflector arranged on an optical path of the charged-particle beam, and a value of the reference width is more than zero and not more than a maximum value of a deflection width of the main deflector.

Further to this aspect of the present invention, a drift correction method, wherein after the reference width is adjusted according to the average value of the area density, the width is further adjusted according to the variation of the area density of the pattern between the stripes.

Further to this aspect of the present invention, a drift correction method, wherein the width of the adjusted stripe is a width corresponding to the variation of a drift from the beginning of irradiation with the charged-particle beam.

According to another aspect of the present invention, a drift correction method comprising the steps of, generating layout data from pattern data of a pattern to be written on a writing area on a sample, dividing the layout data into stripes having a reference width and dividing the layout data into a mesh shape with a predetermined size to form a plurality of small areas, calculating an area density of the pattern for each of the small areas, and obtaining a maximum value of the area densities of the small areas included in the stripe having the reference width, adjusting the reference width according to the maximum value, and writing the pattern on the sample with a charged-particle beam in accordance with adjusted stripes, wherein when the writing of at least one adjusted stripe is terminated, or during the writing of one of the adjusted stripes, writing is stopped to measure a drift amount, and an irradiation position of the charged-particle beam is corrected using the drift amount.

According to one aspect of the present invention, a drift correction method comprising the steps of, generating layout data from pattern data of a pattern to be written on a writing area on a sample, dividing the layout data into stripes having a reference width and dividing the layout data into a mesh shape with a predetermined size to form a plurality of small areas, calculating an area density of the pattern for each of the small areas, and obtaining a minimum value of the area densities of the small areas included in the stripe having the reference width, adjusting the reference width according to the minimum value, and writing the pattern on the sample with a charged-particle beam in accordance with adjusted stripes, wherein when the writing of at least one adjusted stripe is terminated, or during the writing of one of the adjusted stripes, writing is stopped to measure a drift amount, and an irradiation position of the charged-particle beam is corrected using the drift amount.

According to one aspect of the present invention, a pattern writing data generation method for writing a predetermined pattern on a sample with a charged-particle beam, wherein layout data in which the pattern is defined is divided into a plurality of stripes having a width corresponding to an area density of the pattern to create the pattern writing data.

Further to this aspect of the present invention, a pattern writing data generation method, wherein the width of the stripe is a width corresponding to the variation of a drift from the beginning of irradiation with the charged-particle beam.

Further to this aspect of the present invention, a pattern writing data generation method, wherein dividing the layout data into stripes having a reference width and dividing the layout data into a mesh shape with a predetermined size to form a plurality of small areas, calculating an area density of the pattern for each of the small areas, and obtaining an average value of the area densities of the small areas included in the stripe having the reference width, and adjusting the reference width according to the average value.

Further to this aspect of the present invention, a pattern writing data generation method, wherein when the average value of the area density is more than a predetermined value, a stripe has a width narrower than the reference width, and when the average value of the area density is less than the predetermined value, the stripe has a width wider than the reference width.

Further to this aspect of the present invention, a pattern writing data generation method, wherein after the reference width is adjusted according to the average value of the area density, the width is further adjusted according to the variation of the area density of the pattern between the stripes.

DETAILED DESCRIPTION OF THE EMBODIMENTS

Figure 1:
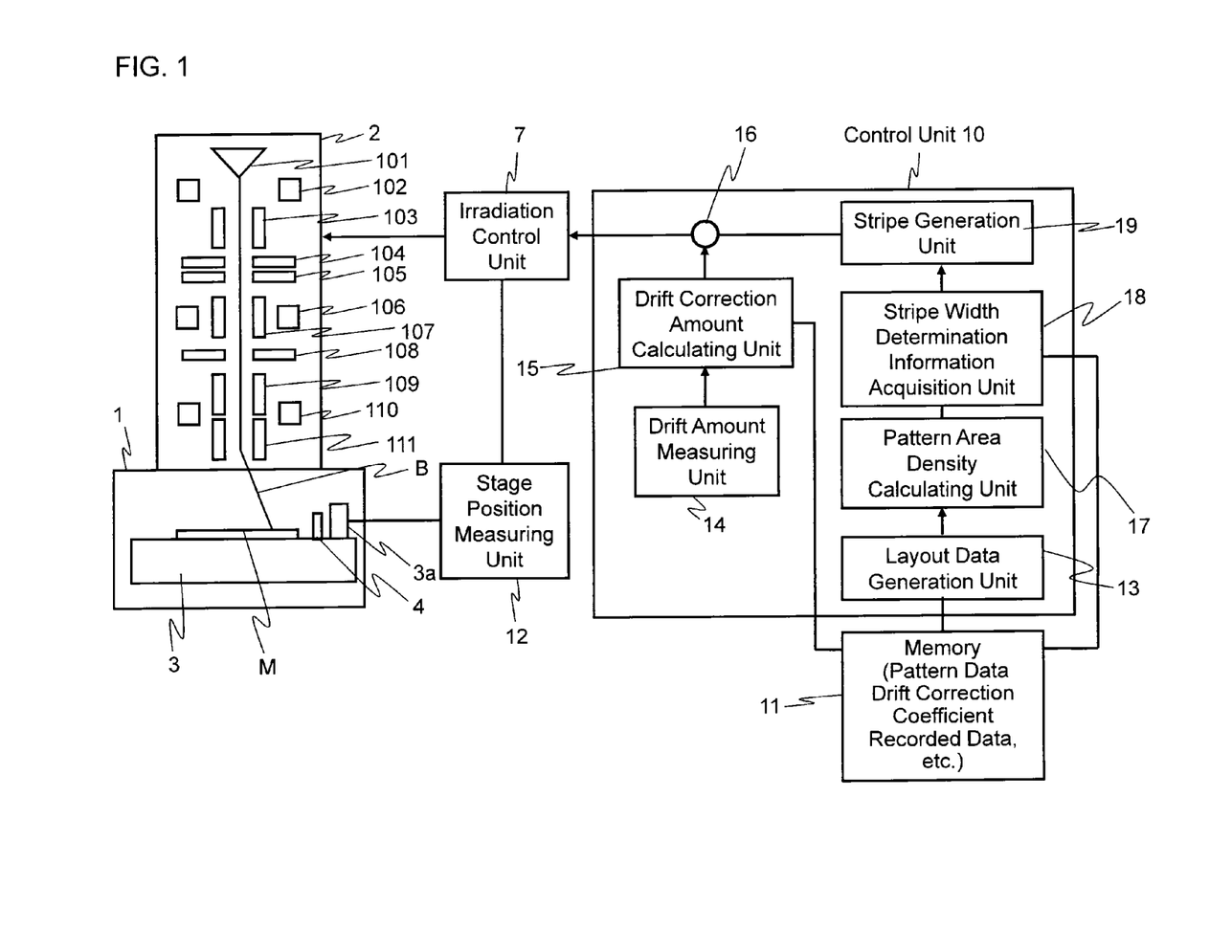
FIG. 1 is a schematic view showing the configuration of an electron beam writing apparatus according to the present embodiment.

FIG. 1 shows an electron beam writing apparatus, which applies an electron beam B to a surface of a mask M and writes a desired pattern. The electron beam writing apparatus is provided with a writing chamber 1 and an electronic optical lens barrel 2 which is an electron beam irradiation device provided upright on a ceiling portion of the writing chamber 1.

A stage 3 is arranged in the writing chamber 1. A mask M is mounted on the stage 3. The mask M is one example of a sample to be written by the electron beam, for example, a glass substrate, a chromium (Cr) film as a light shielding film on the glass substrate, and a resist film on the light shielding film.

The stage 3 can move in X and Y directions perpendicular to the optical axis direction of the electron beam B. A mark stage 4 is provided upright on the stage 3. The mark stage 4 has a reference mark (not shown). It is preferable that the reference mark is formed of a material having an electron reflectivity comparable to the mask M. The reference mark may have a rectangular shape, a circular shape, a triangular shape, a cross shape or the like.

The electron beam writing apparatus detects the position of the reference mark in the middle of writing, whereby the beam drift amount is measured for correcting so that a writing position is a desired position. For example, the coordinates of the reference mark are first obtained immediately before writing. Subsequently, the writing operation is temporarily stopped during writing, and the coordinates of the reference mark are obtained again. For example, the reference mark is scanned with an electron beam, and the reflected electrons are captured in a detector. The position of the reference mark can be detected by analyzing an obtained waveform. Then, a difference from the former coordinates is obtained, and the beam drift amount is detected. The reference mark may be provided on the mask M without providing the mark stage 4.

In FIG. 1, the electronic optical lens barrel 2 forms the electron beam B, emitted from an electron gun 101 built in the electronic optical lens barrel 2, into a required cross-sectional shape, then deflects the electron beam B, and applies the deflected electron beam B to the mask M.

An electron optical column 2 includes an electron gun 101, an illumination lens 102, a blanking deflector 103, a blanking aperture 104, a first shaping aperture 105, a projection lens 106, a shaping deflector 107, a second shaping aperture 108, a main deflector 109, an objective lens 110, and a sub-deflector 111, shown from the top in FIG. 1.

The electron beam B emitted from the electron gun 101 is applied to the first shaping aperture 105 through an illumination lens 102. At the time of blanking on (non-writing period), the electron beam B is deflected by a blanking deflector 103 to be applied to the blanking aperture 104 and not to be applied to the first shaping aperture 105.

The first shaping aperture 105 has a rectangular opening. According to this constitution, when the electron beam B transmits through the first shaping aperture 105, the cross-sectional shape of the electron beam B is formed into a rectangular shape. After that, the electron beam B is projected on a second shaping aperture 108 through a projection lens 106. The shaping deflector 107 changes a position where the electron beam B is projected on the second shaping aperture 108. Consequently, the shape and size of the electron beam B are controlled.

The focus of the electron beam B transmitted through the second shaping aperture 108 is aligned onto the mask M through an objective lens 110. A position where the electron beam B is applied onto the mask M is controlled by a main deflector 109 and a sub deflector 111.

The shape and irradiation position of the electron beam B in the writing chamber 1 and the electronic optical lens barrel 2, the irradiation timing, and so on are controlled by an control unit 10 through an irradiation control unit 7.

In the electron beam writing, a layout of a semiconductor integrated circuit is first designed, and the pattern layout, that is, layout data (design data) in which the shape and position of a figure to be written are defined, is then generated. The layout data is further generated as pattern writing data through various data processes. Writing is performed in accordance with the pattern writing data.

The control unit 10 is connected to a memory 11 which is a storage medium. The memory 11 stores the pattern data. The control unit 10 generates the layout data based on the pattern data from the memory 11.

CAD data prepared by the designer (or user) is converted to design intermediate data in a hierarchical format such as OASIS. The design intermediate data includes data (design pattern data) of the pattern formed on each mask created for each layer. The design pattern data is stored in a memory 11.

It should be noted that, generally, the electron beam writing apparatuses are not adapted to be able to directly read OASIS data. That is, each manufacturer of the electron beam writing apparatus uses different format data. Therefore, OASIS data is converted, for each layer, to format data in a format specific to the electron beam writing apparatus used, and this format data is input to the electron beam writing apparatus.

The format data is input to the control unit 10 via the memory 11. The design pattern data includes pattern features each consisting of basic features such as rectangles and triangles. The control unit 10 generates layout data indicating the shape, size, and position of each pattern feature, specifically, information such as the coordinates (x, y) of the reference position of each feature, the length of its sides, and a shape code (or identifier) identifying the type of shape such as a rectangle or triangle.

Further, a group of pattern features, defined in an area of approximately a few tens of Micrometers Square is referred to as a "cluster" or "cell". It is common practice that the design pattern data is defined in a hierarchical structure using clusters or cells. A cluster (or cell), which contains a pattern feature or features, may be used alone or repeated at certain intervals.

The layout data is divided based on the maximum shot size determined by the size of the electron beam B, and the coordinate positions, size, and exposure time of each divided shot are also set. Then, writing data is generated so that each shot is shaped in accordance with the shape or size of a pattern element to be written. The writing data is divided into stripe regions, and each of the stripe regions is further divided into sub-deflection regions. That is, the writing data of the entire chip has a hierarchical data structure including the data of a plurality of stripes and the data of a plurality of sub-deflection region units arranged in the stripe.

The electron beam apparatus includes a stage position measuring unit 12, which measures a position of X direction and a position of Y direction of the stage 3. The stage position measuring unit 12 includes a laser length measurement unit, which measures a position of the stage 3 by incidence and reflection of a laser to a stage mirror 3a fixed on the stage 3.

The irradiation control unit 7 confirms the position of the stage 3 measured by the stage position measuring unit 12 based on the pattern writing data input from the control unit 10 and meanwhile performs shaping control and deflection control of the electron beam B in the electronic optical lens barrel 2, and the irradiation control unit 7 applies the electron beam B at a required position of the mask M.

Figure 2:
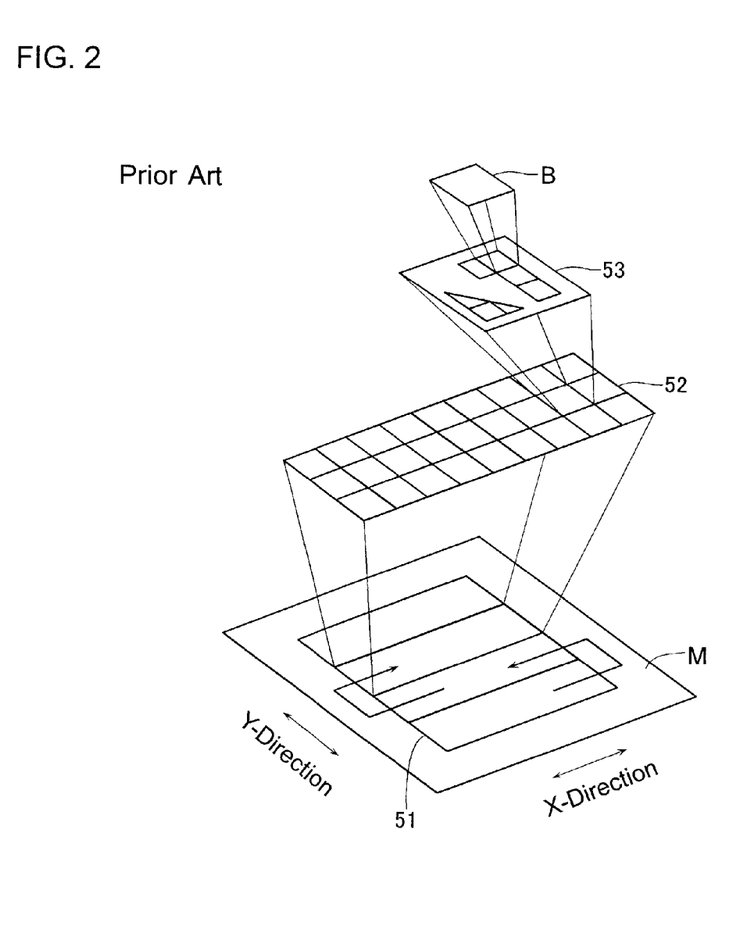
FIG. 2 is a schematic diagram illustrating an electron beam writing method.

FIG. 2 is an illustrative diagram of writing with the electron beam 200. As shown in FIG. 2, a writing region 51 on the mask M is divided into a plurality of stripes 52. Writing with the electron beam B is repeated for each stripe 52 while the stage 3 continuously moves in one direction, for example in the plus or minus X-direction. The stripes 52 is further divided into a plurality of sub-deflection regions 53, and the electron beam B writes only the necessary internal portions of each sub-deflection region 53. In FIG. 2, the width of each of the stripes 52 is the same. The stripes 52 are a rectangular writing region determined by the deflection width of the main deflector 109, and the sub-deflection region 53 is a writing region determined by deflection width of the sub-deflector 111.

The determination of the standard position of the sub-deflection regions 53 is done with the main deflector 109; writing inside the sub-deflection regions 53 is controlled by sub-deflector 111. That is, the electron beam B is positioned in the specified sub-deflection regions 53 by the main deflector 109, determining the writing position inside sub-deflection regions 53 by the sub-deflector 111. Furthermore, the shaping deflector 107, and the first aperture 105 and the second aperture 108 for shaping the electron beam determine the shape and size of the electron beam B. While the stage 3 is continuously moved in one direction a pattern is written in the inside of the sub-deflection region 53, and upon completion of the writing, the next sub-deflection region 53 is written. When the writing in the entire sub-deflection area 53 in the stripe 52 is terminated, that is, when writing reaches the stripe end (tail end of the stripe), the stage 3 is step-moved in a direction (for example, the Y direction) perpendicular to a direction in which the stage 3 is continuously moved. Similar processing is then repeated for sequential writing of the stripes 52.

The sub-deflection regions 53 are regions, which are scanned and written by the electron beam B, faster than scanning and writing of main deflection regions by sub-deflector 111, sub-deflection regions 53 are usually the smallest writing regions. When writing is performed inside the sub-deflection regions 53, the size and shape of shot are prepared according to the pattern shape; the shaping deflector 107 then forms the desired shot. Specifically, the electron beam B is irradiated from the electron gun 101, the first shaping aperture 105 forms the beam into a square shape, the electron beam is then projected to the second shaping aperture 108 by the shaping deflector 107, the 2nd aperture 18 changes the beam shape and size. After that, the electron beam B deflected by the sub-deflector ill and the main deflector 109 is irradiated to the mask M that is mounted on stage 3.

In the prior art, after the stripe end is written in accordance with a previously set correction interval, an electron beam irradiation position is moved to a reference mark, and the reference mark is scanned with the electron beam to detect the position of the reference mark. Then, in the drift correction, a value obtained by linear interpolation of a difference between the detected position and the last detected position is defined as a position variation before the start of the next detection. In this case, the drift amount is measured at a constant time interval. Accordingly, when a correction error is to be reduced, the time interval of the measurement is required to be reduced to increase the number of times of detecting the reference mark. However, this constitution leads to an increase in the writing time.

In conventional methods, the pattern writing data has been divided into a plurality of stripes having the same width. Meanwhile, in the present embodiment, the width of the stripe is changed according to an area density of a pattern to be written on the mask M. More specifically, the writing area of the mask M is divided into stripes so that the width of the stripe corresponds to the area density of a figure pattern written on the mask M. The pattern writing data is obtained by dividing the layout data in which the figure pattern is defined into a plurality of stripes having a width corresponding to the area density of the figure pattern.

In the present embodiment, the width of the stripe is determined as follows. However, the present invention is not limited thereto.

First, the writing area is divided into stripes having a reference width and, at the same time, divided into a mesh shape with a predetermined size to form a plurality of small areas. Although the "reference width" can be suitably set, the upper limit is the maximum value of a deflection with of a main deflector, and the lower limit may be a value larger than zero, for example, a deflection width of a sub deflector. The mesh in fogging correction (to be described later) may be the same as a mesh used in the calculation of the area density of the pattern. Subsequently, the pattern area density is calculated for each small area, and an average value of the area densities of the small areas included in the stripe having a reference width is obtained. The average value is the pattern area density in the present embodiment. The reference width is adjusted according to the obtained average value. For example, when the average value of the area density is larger than a predetermined value, the stripe has a width smaller than the reference width and, more specifically, has a width larger than zero and smaller than the reference width. Meanwhile, when the average value of the area density is smaller than the predetermined value, the stripe has a width larger than the reference width and, more specifically, has a width not more than the maximum value of a deflection width of a main deflector and larger than the reference width. The maximum value of the area density of the small area included in the stripe having a reference width is obtained, and the reference width may be adjusted according to the maximum value. Alternatively, the minimum value of the area density of the small area included in the stripe having the reference width is obtained, and the reference width may be adjusted according to the minimum value.

The pattern area density and the drift amount are correlated with each other, and in general, the larger the pattern area density, the larger the drift amount. Thus, for example, when the average value of the pattern area density in a single stripe is 50% or more, the stripe is divided into two portions in a direction perpendicular to the width direction of the stripe. Accordingly, since the stripe end is doubled, the operation of detecting the position of the reference mark can be doubled after writing of the stripe end. Further, since the width of the stripe is half a reference stripe width, a time required for the writing reaching the stripe end is reduced. Namely, in the detection of the position of the reference mark performed using the electron beam, since the time for the next detection can be reduced, a drift unable to be found in conventional methods can be detected. Consequently, the accuracy of the drift correction can be enhanced more than before.

Meanwhile, when the area density of the pattern is small, it is predicted that the drift amount is reduced, and therefore, the stripe width can be increased more than a reference value. According to this constitution, since a number of times of detecting the reference mark can be reduced, the number of detection times of the reference mark increased by reducing the stripe width is offset, and the entire writing time can be prevented from increasing.

Figure 3:
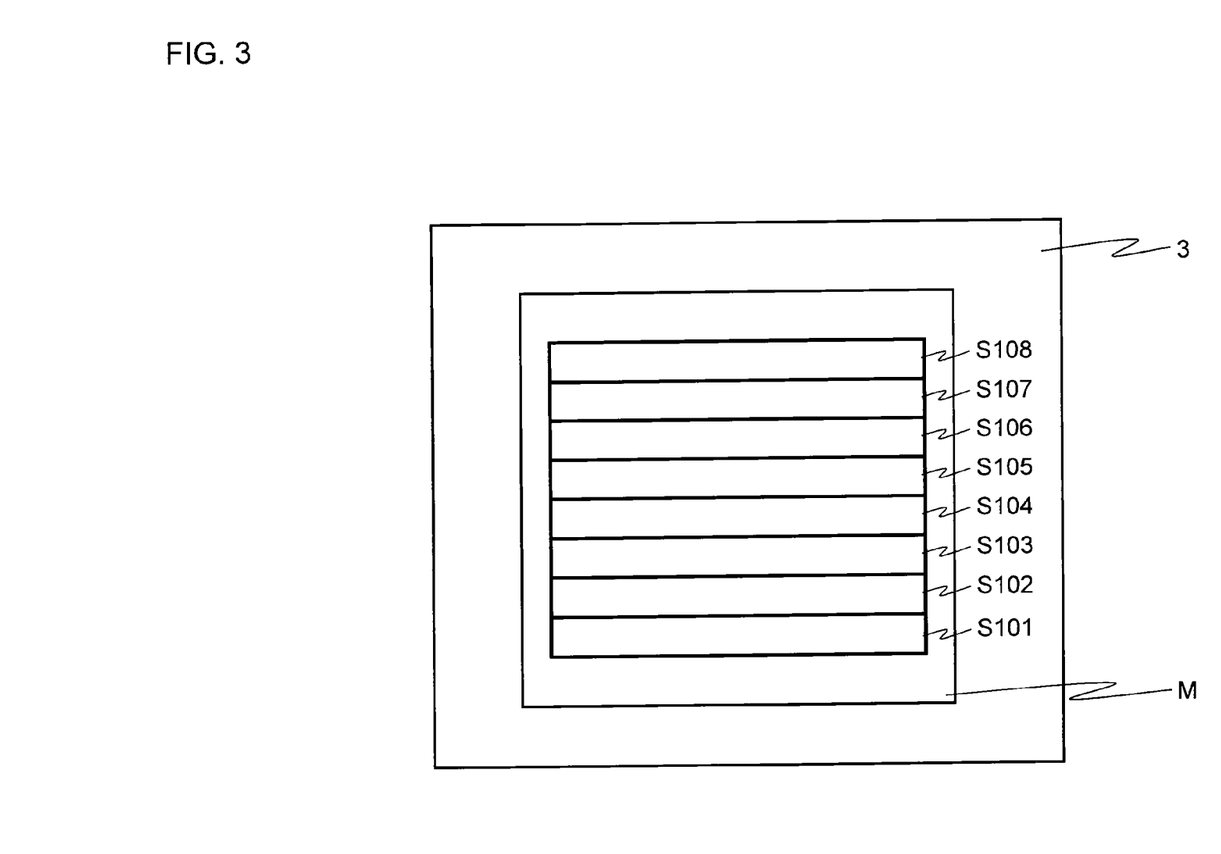
FIG. 3 shows a comparative example of the present embodiment, and in the comparative example, all the stripes have the same reference width.

FIG. 3 shows a comparative example of the present embodiment, and in the comparative example, all the stripes have the same reference width. S101 to S108 respectively show the stripe.

In FIG. 3, after the stripe end of S101 is written, for example, an electron beam irradiation position is moved to a reference mark, and the reference mark is scanned with the electron beam to detect the position of the reference mark. Next, the stripe S102 is written, and then the stripe S103 is written. After the stripe end of S103 is written, an electron beam irradiation position is moved to a reference mark, and the reference mark is scanned with the electron beam to detect the position of the reference mark. Then, a value obtained by linear interpolation of a difference between the detected position and the last detected position is defined as a position variation before the start of the next detection, and drift correction is performed.

Next, the stripe S104 is written followed by the stripe S105. After the stripe end of S105 is written, an electron beam irradiation position is moved to a reference mark, and the reference mark is scanned with the electron beam to detect the position of the reference mark. In the same way, the stripe S106 is written, and after the stripe S107 is written, the electron beam is irradiated to detect the position of the reference mark. Then, a value obtained by linear interpolation of a difference between the detected position and the last detected position is defined as a position variation before the start of the next detection, and the drift correction is performed.

If the correction accuracy is to be improved when all the stripes have the same width as shown in FIG. 3, the number of detection of the reference mark is increased. This constitution leads to increase in the entire writing time.

Figure 4:
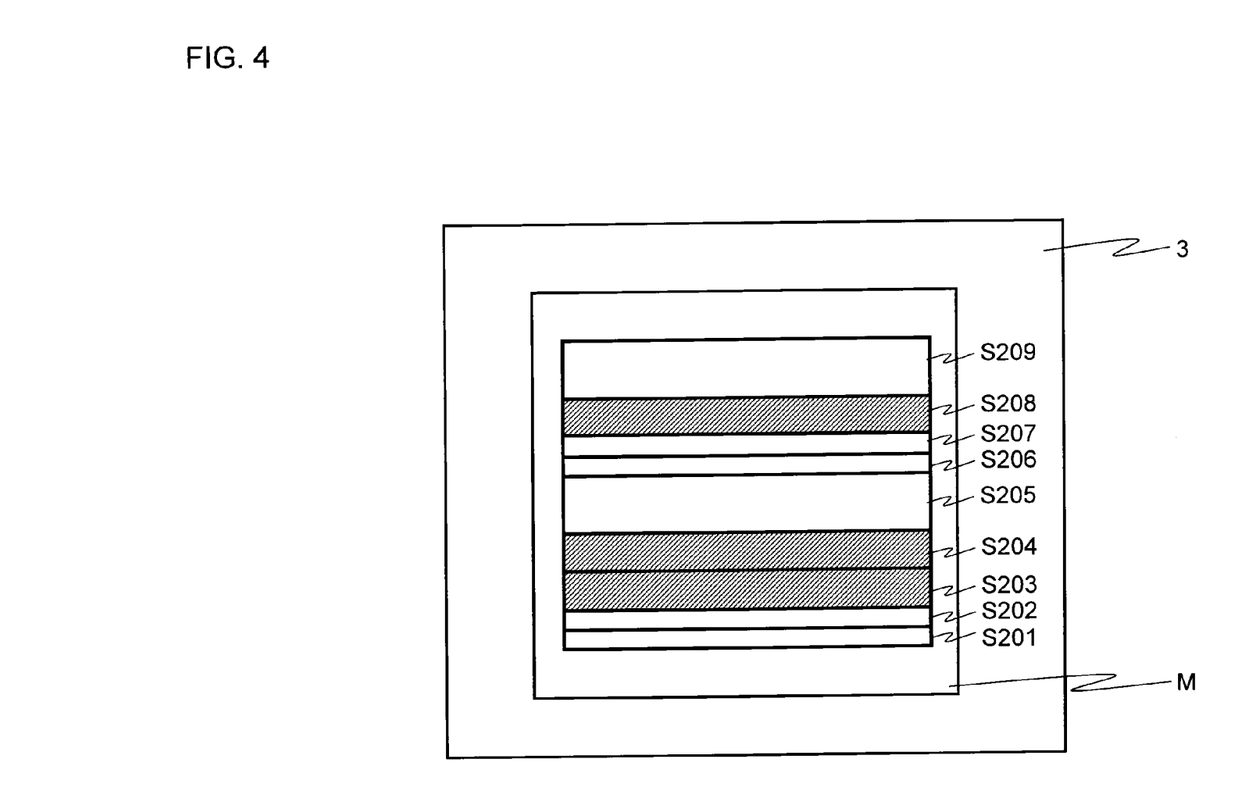
FIG. 4 shows an example in which the stripes have a different width according to the present embodiment.

FIG. 4 shows an example in which the stripes have different width according to the present embodiment. A pattern to be written on the mask M is the same as the example in FIG. 3.

In FIG. 4, S203, S204, and S208 have the same width as the stripes of FIG. 3. The width of those stripes is a reference width.

Although each stripe width of S201, S202, S206, and S207 is smaller than the reference stripe width, each stripe width of S205 and S209 is wider than the reference width.

In the present embodiment, the drift amount is measured after writing of at least one stripe is terminated. The timing of measurement of the drift amount is previously determined before the beginning of writing.

For example, after the stripe end of S201 is written, an electron beam irradiation position is moved to a reference mark, and the reference mark is scanned with the electron beam to detect the position of the reference mark. Next, after the stripe end of S202 is written, the electron beam detects the reference mark in the same way. Then, a value obtained by linear interpolation of a difference between the detected position and the last detected position is defined as a position variation before the start of the next detection, and the drift correction is performed.

Regarding S203, after the stripe end is written, an electron beam irradiation position is moved to a reference mark, and the reference mark is scanned with the electron beam to detect the position of the reference mark. Next, the stripes S204, S205, and S206 in order are written. After the stripe end of S206 is written, an electron beam irradiation position is moved to a reference mark, and the reference mark is scanned with the electron beam to detect the position of the reference mark. Then, a value obtained by linear interpolation of a difference between the detected position and the last detected position is defined as a position variation before the start of the next detection, and the drift correction is performed.

After the stripe end of S207 is written, an electron beam irradiation position is moved to a reference mark, and the reference mark is scanned with the electron beam to detect the position of the reference mark. Next, after the stripe end of S208 is written, an electron beam irradiation position is moved to a reference mark, and the reference mark is scanned with the electron beam to detect the position of the reference mark. Then, a value obtained by linear interpolation of a difference between the detected position and the last detected position is defined as a position variation before the start of the next detection, and the drift correction is performed.

When the stripe width is changed as shown in FIG. 4, the accuracy of the drift correction can be enhanced while an increase in the entire writing time is suppressed. This will be described while being compared with the example in FIG. 3.

In FIG. 4, S201 and S202 are obtained by dividing a reference stripe into two portions in the direction perpendicular to the width direction of the reference stripe. Meanwhile, all the stripe widths in FIG. 3 are the reference stripe widths. Accordingly, in this case, the width of S101 of FIG. 3 coincides with the width obtained by combining the widths of S201 and S202 of FIG. 4.

In FIG. 3, regarding the stripe S101, writing is performed until reaching the stripe end; the electron beam irradiation position is then moved to the reference mark. The position of the reference mark is detected by being scanned with an electron beam. Meanwhile, as shown in FIG. 4, regarding the stripe S201, writing is performed until reaching the stripe end; the position of the reference mark is then detected. Subsequently, in the stripe S202, writing is performed until the stripe end is written, and the position of the reference mark is then similarly detected. Namely, in the example of FIG. 4, the position of the reference mark is detected twice during a period from the beginning of writing to the detection of the position of the reference mark in the example of FIG. 3.

When the pattern area density in S101 is larger than the pattern area density in S102, it is predicted that the drift amount in S101 is larger than the drift amount in S102. Thus, when S101 is written in the same amount of writing time as S102, the drift may not be satisfactorily detected.

In contrast, in the example of FIG. 4 (S201 and S202), since the reference mark is detected twice during a single detection of the reference mark in the example of FIG. 3 (S101), the drift that cannot be detected in the example of FIG. 3 can be detected. Accordingly, according to the example of FIG. 4, the drift correction accuracy can be enhanced compared with the example of FIG. 3.

Figure 5:
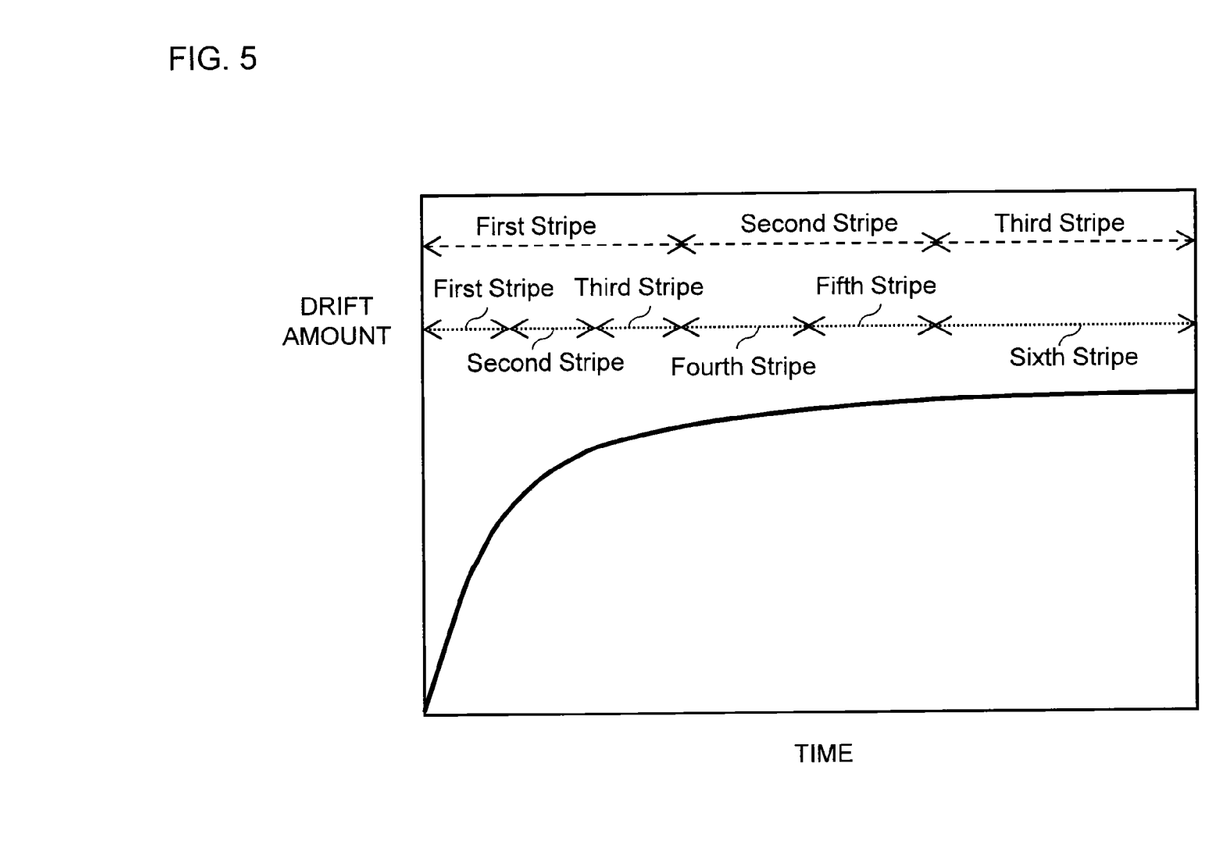
FIG. 5 shows drift variation which changes over time and two examples of different time intervals for drift correction.

In general, the variation of the drift increases immediately after beginning of irradiation with the electron beam, regardless of the pattern area density. FIG. 5 shows such a state.

As illustrated by a solid line in FIG. 5, the drift variation is large immediately after the beginning of irradiation with the electron beam and then is gradually reduced. It is presumed that this fact is due to that an optical system and a detector in an electron beam writing apparatus are not charged up at the beginning of irradiation with the electron beam. Thus, it is preferable that an interval of the drift correction immediately after the beginning of irradiation with the electron beam is as short as possible. In the present embodiment, it is preferable that the stripe width is reduced so that the correction interval immediately after the beginning of irradiation with the electron beam is as short as possible.

In FIG. 5, a dashed line shows a time interval in the measurement of the drift amount, and FIG. 5 shows an example in which the stripe width is determined considering only the area density of the pattern. Namely, the corresponding first, second, and third stripes are written for each period of time shown by the dashed line.

In the example illustrated by the dashed line, the irradiation with the electron beam is started in the first stripe. For example, after the stripe end of the first stripe is written, an electron beam irradiation position is moved to a reference mark, and the reference mark is scanned with the electron beam to detect the position of the reference mark. After the stripe end of the second stripe is written, an electron beam irradiation position is moved to a reference mark, and the reference mark is scanned with the electron beam to detect the position of the reference mark. After the writing is performed to reach the stripe end, the electron beam detects the position of the reference mark. Then, a value obtained by linear interpolation of a difference between the detected position and the last detected position is defined as a position variation before the start of the next detection, and the drift correction is performed.

The respective patterns of the dashed first, second, and third stripes have the same area density. Accordingly, those stripes have the same width, and the time interval during which the drift amount is measured is equal in each stripe as illustrated by the dashed line.

Meanwhile, in FIG. 5, a dotted line shows another example of the time interval in the drift amount measurement. This case corresponds to a case where the stripe width is determined considering not only the pattern area density but also the drift variation immediately after irradiation with the electron beam. The corresponding first to sixth stripes are written for each period of time illustrated by the dotted line.

Regarding the drift amount shown by the solid line in FIG. 5, the variation found when the dashed first stripe is written is larger than the variation found when the dashed second stripe is written. When the dashed third stripe is written, the drift amount is substantially constant. Accordingly, it is preferable in view of enhancement of the accuracy of the drift correction to determine the stripe width so that the measurement interval corresponds to the drift variation. Namely, at a portion where the variation is large, the stripe width is reduced to shorten the measurement interval, and at a portion where the variation is small, the stripe width is increased to lengthen the measurement interval. The stripes thus obtained are the first to sixth stripes, and the time interval in the drift amount measurement is shown by the dotted line.

In FIG. 5, the drift variation found when the first stripe is written is larger than the drift variation found when the fourth stripe is written, for example. The interval of the dotted line corresponding to the first stripe is shorter than the interval of the dotted line corresponding to the fourth stripe. This constitution shows that the time of writing of the first stripe is shorter than the time of writing of the fourth stripe and namely shows that the time interval before the drift amount measurement in the first stripe is shorter than that in the fourth stripe.

Further in FIG. 5, for example, the drift variation found when the sixth stripe is written is smaller than the drift variation found when the first stripe is written, for example. The interval of the dotted line corresponding to the sixth stripe is longer than the interval of the dotted line corresponding to the first stripe. This constitution shows that the time of writing of the sixth stripe is longer than the time of writing of the first stripe and namely shows that the time interval before the drift amount measurement in the sixth stripe is longer than that in the first stripe For example, the dotted first, second, and third stripes are obtained by dividing the dashed first stripe into three portions in a direction perpendicular to the width direction. Those stripes are written in that order, and in each stripe, the position of the reference mark is detected after writing is performed to reach each stripe end. Namely, in this case, the detection of the position is performed three times during a period from the writing of the dashed first stripe to the detection of the reference mark.

The dotted fourth and fifth stripes are obtained by dividing the dashed second stripe into two portions in a direction perpendicular to the width direction. Those stripes are written in that order, and in each stripe, the position of the reference mark is detected after writing is performed to reach each stripe end. Namely, in this case, the detection of the position is performed twice during a period from the writing of the dashed second stripe to the detection of the reference mark.

The dashed sixth stripe has the same width as the dashed third stripe and is written in a similar manner to the third stripe. After writing reaches the stripe end, the position of the reference mark is detected in each stripe.

As described above, according to the dotted six stripes, since the number of times of measurement is increased at the portion where the drift variation is large, the accuracy of the drift correction can be enhanced. Meanwhile, since the number of times of measurement is reduced at the portion where the drift variation is small, this constitution can suppress that the entire writing time becomes longer due to the increase in the number of times of measurement at the portion where the drift variation is large.

As mentioned above, the pattern area density and the drift amount are correlated with each other, and the larger the pattern area density, the larger the drift amount. The variation of the pattern area density between the stripes also affects the drift amount. Namely, the larger the variation of the pattern area density, the larger the drift amount becomes. Thus, when the stripe width is determined, it is preferable to consider not only the pattern area density but also the variation of the pattern area density. More specifically, it is preferable to further reduce the width of a stripe in which the pattern area density is larger and the variation of the pattern area density relative to a stripe to be written next is larger. It is more preferable to consider the drift variation from the beginning of irradiation with the electron beam.

For example, the writing area is divided into stripes having a reference width and, at the same time, divided into a mesh shape with a predetermined size to form a plurality of small areas. Then the pattern area density is calculated for each small area, and an average value of the area densities of the small areas included in the stripe having a reference width is obtained. The reference width is adjusted according to the obtained average value. After that, the width is further adjusted according to the variation of the pattern area density between the stripes.

Next, a writing method according to the present embodiment will be described using FIG. 1 and FIG. 6.

Figure 6:
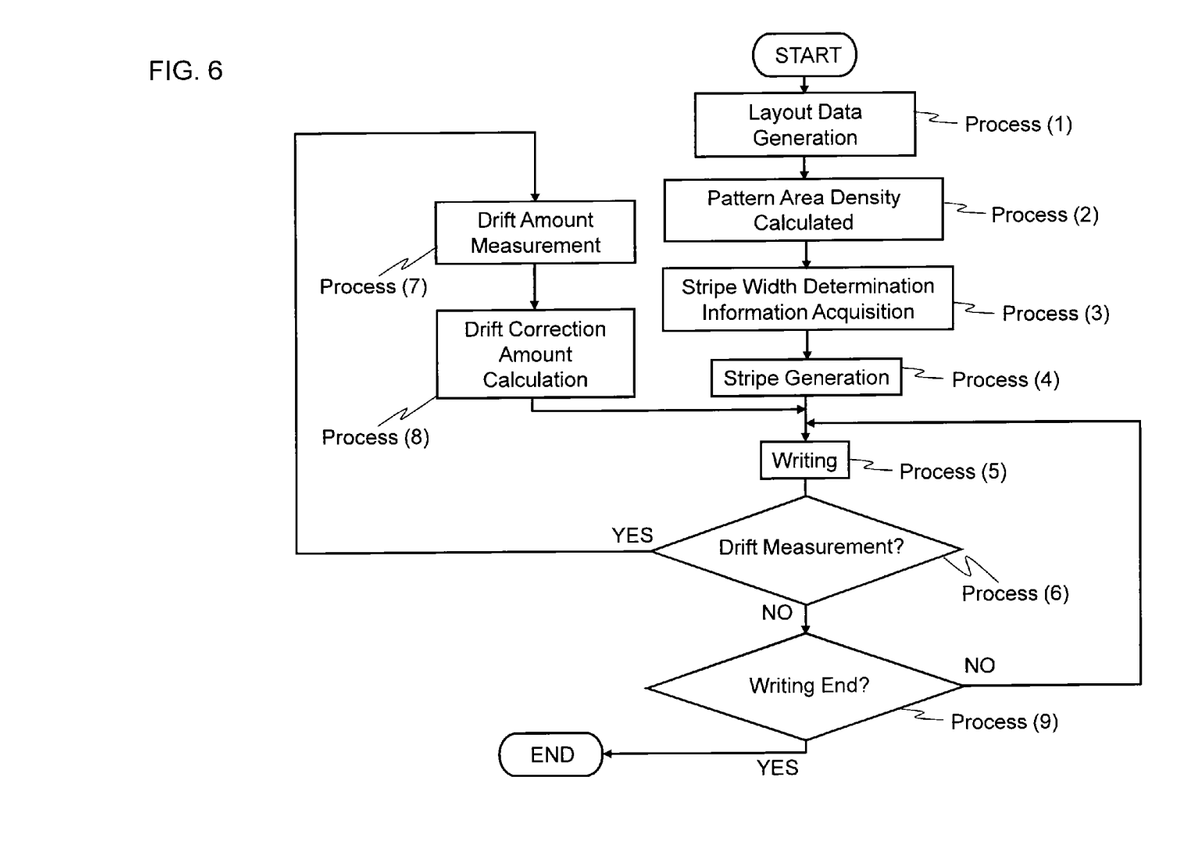
FIG. 6 shows a drift correction method and pattern writing data generation method according to the present embodiment.

First, the layout data is generated in a layout data generation unit 13 of the control unit 10 based on pattern data from the memory 11 of FIG. 1 (process (1) in FIG. 6).

Next, the area density of the pattern of the layout data is obtained in a pattern area density calculating unit 17 (process (2)). For example, the reference stripe width is determined, and, at the same time, the main deflection area is divided into a mesh shape. The pattern area density is then calculated for each mesh, and an average value of the pattern area density of a mesh included in a single stripe is obtained. In the pattern area density calculating unit 17, the variation of the pattern area density between the stripes can be obtained.

In an electron beam writing apparatus, a fogging effect is the phenomenon wherein an electron irradiated to a resist film is reflected on the surface of the resist film, it is then reflected from the optical unit of the electron beam writing apparatus, and then re-irradiated over a wide region of resist film. This phenomenon is caused by a secondary electron being irradiated to the resist film. A dimension of a pattern to be written is varied by the fogging effect. Thus, an accumulated irradiation amount of the electron beam accumulated in a resist is adjusted. At this time, since a surrounding pattern area density affects the dimensional variability, the dimensional variability is corrected using a value of the pattern area density. In the present embodiment, the pattern area density obtained in the fogging correction may be utilized. For example, in the process (2) in FIG. 6, a map of the pattern area density obtained in the fogging correction may be sent to the pattern area density calculating unit 17.

A stripe width determination information acquisition unit 18 obtains information to determine what kind of stripe the layout data is to be divided into (process (3)). For example, information about the pattern area density obtained in the pattern area density calculating unit 17 and the variation of the pattern area density between the stripes are information obtained by the stripe width determination information acquisition unit 18.

Recorded data stored in the memory 11 is one piece of information obtained by the stripe width determination information acquisition unit 18. The recorded data in this case is information about the layout pattern previously written and information required to reduce a difference from a design value, remaining after the drift correction, smaller than a reference value.

In the drift correction, the drift value at the time of writing is predicted by interpolation. Namely, in the drift correction, the reference mark provided on the mask is detected to calculate the drift amount, and thus, to perform forecasting calculation of the drift value at the time of writing by interpolation. Thus, no matter how much the drift correction accuracy is enhanced, it is difficult to completely match the writing position and the design position after the drift correction with each other. In the present application, a difference between the writing position and the design position after the drift correction is referred to as a "correction residual error".

The correction residual error is required to be satisfactorily reduced more than the positional accuracy of a mask pattern. Particularly, in recent years when miniaturization of a circuit pattern has progressed, the correction residual error is required to be further reduced. Thus, information to be used as the recorded data, which is required to reduce the correction residual error smaller than a reference value, is stored in the memory 11 based on the past pattern writing data. For example, a map of the drift amount associated with a pattern similar to a pattern to be presently written among the previously written layout patterns is one piece of recorded data. Among the recorded data, the data of the drift variation immediately after the beginning of irradiation with the electron beam (as shown in FIG. 5) is one piece of important information referred to when the stripe width is determined.

In the present embodiment, when the pattern area density obtained in the fogging correction is utilized, the map is sent to the stripe width determination information acquisition unit 18, and the map may be used as one of the information used when the layout data is divided into stripes. In this case, the process (2) in FIG. 6 may be omitted.

The stripe generation unit 19 divides the layout data into strips with a predetermined width based on information from the stripe width determination information acquisition unit 18 (Step 4). The width of the stripe is changed according to an area density of a pattern of the layout data. For example, it is assumed that the data from the pattern area density calculating unit 17 is pattern area density of each stripe when the layout pattern is divided into a plurality of stripes with standard width. In this case, when the pattern area density is at a predetermined value or more than a predetermined value, the width of the stripe is narrower than the standard width. When the pattern area density is at a predetermined value or less than a predetermined value, the width of stripe is wider than the standard width. For example, when the pattern area density in a single stripe is 50% or more, the stripe is divided into two portions in a direction perpendicular to the width direction of the stripe.

In the stripe generation unit 19, it is preferable to determine the stripe width, considering not only the pattern area density but also the drift variation immediately after the beginning of irradiation with the electron beam B and the variation of the pattern area density between the stripes.

In the first stripe in which the irradiation with the electron beam B has begun, since there is no stripe written prior to the first stripe, the variation of the pattern area density cannot be obtained. Thus, in the first stripe, the drift amount of the first stripe in a similar pattern is referred to from the recorded data stored in the memory 11, and the stripe width can be determined. Alternatively, as described above, since a tendency to increase the drift variation in the first stripe does not depend on the pattern area density, the width of the first stripe may be set regardless of the kind of the pattern.

The layout pattern is divided into predetermined stripes in the stripe generation unit 19, whereby the pattern writing data is generated. The pattern writing data is sent to the irradiation control unit 7, and writing is performed (process (5)). Specifically, the irradiation control unit 7 confirms the position of the stage 3 measured by the stage position measuring unit 12 based on this pattern writing data and meanwhile performs shaping control and deflection control of the electron beam B in the electronic optical lens barrel 2, and the irradiation control unit 7 applies the electron beam B at a required position of the mask M.

After the first stripe is written and the writing reaches the stripe end of the first stripe, whether or not the drift amount is measured is determined in the process (6). When the measurement is performed, the flow proceeds to the process (7). More specifically, the irradiation position of the electron beam B is moved to the reference mark. Then, the position of the reference mark is scanned with the electron beam B to detect the position, and thus, to measure the drift amount in a drift amount measuring unit 14.

Then, a drift correction value is calculated in a drift correction amount calculating unit 15 based on the measured drift amount (process (8)). Since the memory 11 stores correction coefficients, the information is retrieved from the drift correction amount calculating unit 15, and a correction value corresponding to the drift amount is calculated.

The pattern writing data generated in a stripe generation unit 19 is data of a design value. Thus, the pattern writing data of the design value and the data of the correction value from the drift correction amount calculating unit 15 are added and combined by an adding calculator 16. According to this constitution, the pattern writing data of the design value is rewritten, and the pattern writing data in which the beam drift amount is corrected is obtained.

Subsequently, the second stripe is written based on the corrected pattern writing data (process (5)).

After the writing process reaches the stripe end of the second stripe, whether or not the drift amount is measured is determined in the process (6). When the drift amount is measured, the processes (7) and (8) are performed, and then the flow returns to the process (5) to perform writing.

In the process (6), when it is determined that the drift amount is not measured, whether or not writing is terminated is determined in the process (9). When there is a pattern to be written, the flow returns to the process (5) to perform writing. At this time, the drift amount in the third stripe is predicted by interpolation from the drift amount measured last time, and the correction value based on the drift amount is calculated in the drift correction amount calculating unit 15 and added to the pattern writing data of the third stripe. After that, the third stripe is written based on the corrected pattern writing data. Meanwhile, when there is no pattern to be written in the process (9), the above series of writing processes is terminated.

Figure 7:
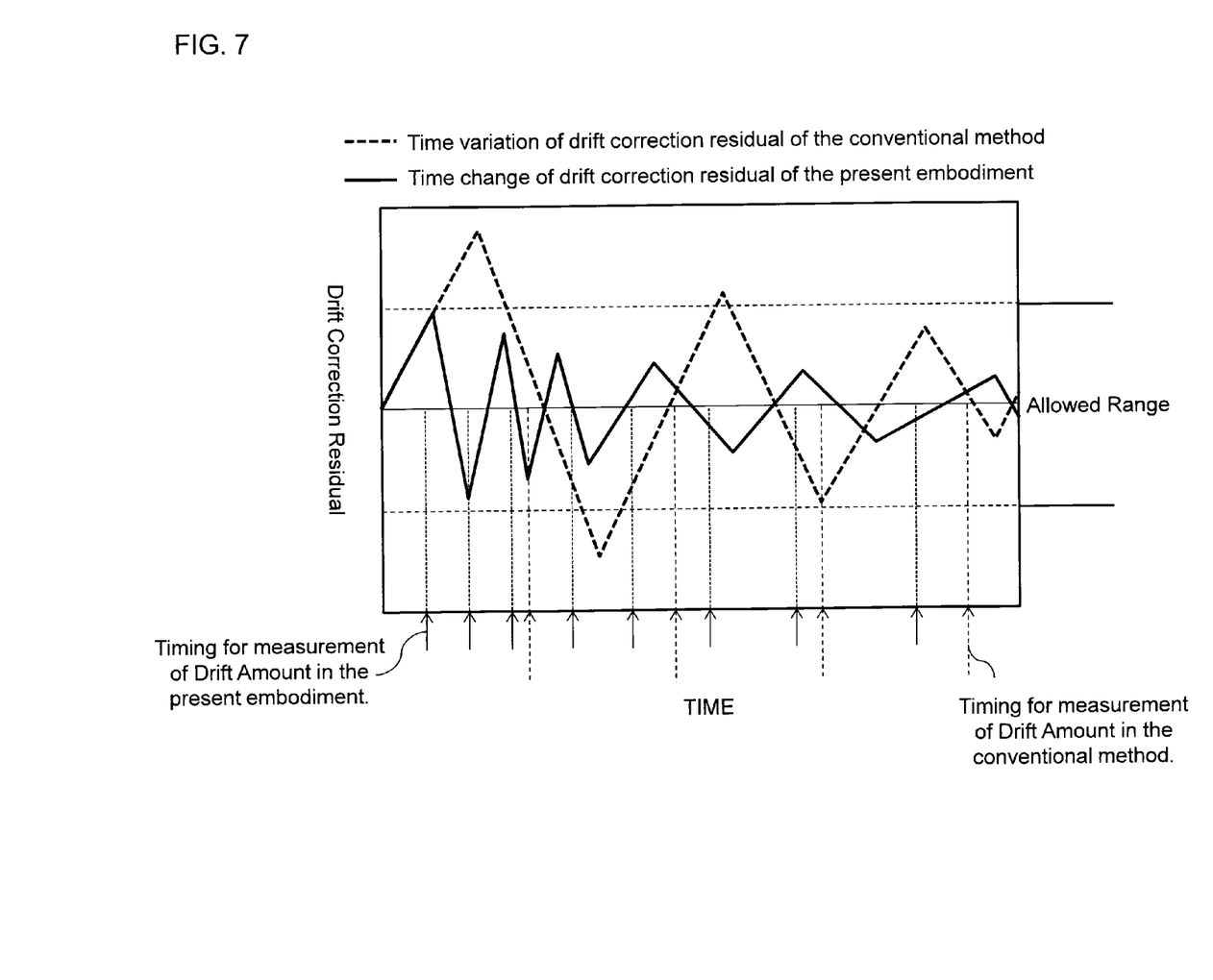
FIG. 7 shows an example in which a time change of the drift correction residual error in the present embodiment is compared with that in a conventional method.

FIG. 7 shows an example in which a time change of the drift correction residual error in the present embodiment is compared with that of a conventional method.

The dashed line shows a time change of the correction residual error in the conventional method. The dashed arrow shows a timing of the drift amount measurement in the conventional method.

In the conventional method, the position of the reference mark in the middle of writing is detected at a constant time interval. Namely, as shown by the dashed arrow, the drift amount is measured at a constant time interval. Thus, when a drift occurs between measurements, the occurrence of the drift cannot be detected. Consequently, the accuracy of the drift correction is lowered, and the correction residual error is beyond an allowable range. Especially, immediately after the beginning of writing, the drift variation is large, and therefore, as shown in FIG. 7, the correction residual error beyond the allowable range often occurs. The size of the allowable range is a value satisfactorily smaller than the positional accuracy of the mask pattern.

Meanwhile, in FIG. 7, the solid line shows the time change of the correction residual error according to the present embodiment. The solid arrow shows a timing of the drift amount measurement in the present embodiment.

In the present embodiment, the width of the stripe is changed according to the pattern area density, whereby the interval of the drift measurement is changed between the stripes. If the area density of the pattern is the same, the time required for writing performed until reaching the stripe end in the stripe having a small width is shorter than that in the stripe having a large width. The drift amount is measured after writing reaches the stripe end, and therefore, if the writing time reaching the stripe end is reduced, the time interval in the drift measurement is reduced. Accordingly, an abruptly occurring drift difficult to be detected in the conventional method can be detected, and the correction accuracy can be enhanced; therefore, the correction residual error can be prevented from being beyond the allowable range.

In the present embodiment, the stripe width is determined considering the magnitude of the drift variation immediately after the beginning of writing, whereby the accuracy of the drift correction can be further enhanced. The interval of the drift measurement is increased at the portion where the pattern area density is small, whereby it is possible to suppress the entire writing time becoming long.

The features and advantages of the present invention may be summarized as follows.

According to the first embodiment, the layout data is divided into stripes having a reference width and, at the same time, divided into a mesh shape with a predetermined size to form a plurality of small areas. Then the pattern area density is calculated for each small area, and an average value of the area densities of the small areas included in the stripe having a reference width is obtained. The reference width is adjusted according to the obtained average value. Therefore the first embodiment provides a drift correction method, which detects a drift conventionally difficult to be detected and can improve correction accuracy.

According to the second embodiment, writing data is obtained by dividing the layout data in which a pattern is defined into a plurality of stripes having a width corresponding to the area density of the pattern. Therefore the second embodiment provides a writing data generation method suitable for a drift correction method, which detects a drift conventionally difficult to be detected and can improve correction accuracy.

According to the third embodiment, a writing area of a sample is divided into a plurality of stripes so that width of a stripe corresponds to area density of a pattern written on the sample. Therefore the third embodiment provides a drift correction method, which detects a drift conventionally difficult to be detected and can improve correction accuracy.

The present invention is not limited to the above embodiments and may be modified in various forms without departing from the scope of the invention.

For example, in the above-mentioned embodiment, writing is stopped and the drift amount is measured after writing of at least one stripe is terminated, that is, the writing reaches the stripe end. However the present invention is not limited to this embodiment.

In the present embodiment, writing is stopped during writing of one of the stripes, and the drift amount may be measured. Consequently, the time interval in the drift measurement can be further reduced. The measurement time can be reduced at specified portions such as a portion where the pattern density is large in the stripe and a portion where it is predicted from the recorded data that the drift amount is large. As an example, when the pattern area density is calculated for each small area obtained by dividing the writing area into a mesh shape with a predetermined size, the drift amount can be measured after writing of a predetermined small area.

A case where writing is stopped after writing of at least one stripe is terminated to measure the drift amount and a case where writing is stopped during writing of one of the stripes to measure the drift amount may be combined. Namely, there may be provided a case where the drift amount is measured after writing reaches the stripe end with respect to a single mask and a case where the drift amount is measured during writing of one of the stripes. According to this constitution, the accuracy of the drift correction can be further enhanced.

Although in the present embodiment, the electron beam writing apparatus having a main deflector and a sub deflector has been described, the present invention is not limited thereto. The electron beam writing apparatus does not require two stages including the main deflector and the sub deflector (or a plurality of stages) and may determine the irradiation position on a mask while deflecting the electron beam with a single stage of a deflector and write a pattern.

Further, in the above-mentioned execution an electron beam was used, however, the present invention is not limited thereto and may utilize a different charged particle beam, for example an ion beam.

What is claimed is:

1. A drift correction method comprising:
dividing a writing area of a sample into a plurality of stripes having a width corresponding to an area density of a pattern to be written on the sample with a charged-particle beam;
stopping writing when at least one stripe is terminated, or during writing of one of the stripes and measuring a drift amount; and
correcting an irradiation position of the charged-particle beam with the use of the drift amount.

2. The drift correction method according to claim 1, wherein the writing area is divided into stripes having a reference width and divided into a mesh shape with a predetermined size to form a plurality of small areas, an area density of the pattern is calculated for each of the small areas, an average value of the area density of the small area included in the stripe having the reference width is obtained, and the reference width is adjusted according to the average value.

3. The drift correction method according to claim 2, wherein when the average value of the area density is more than a predetermined value, a stripe has a width narrower than the reference width, and when the average value of the area density is less than the predetermined value, the stripe has a width wider than the reference width.

4. The drift correction method according to claim 2, wherein after the reference width is adjusted according to the average value of the area density, the width is further adjusted according to the variation of the area density of the pattern between the stripes.

5. The drift correction method according to claim 1, wherein the width of the stripe is a width corresponding to the variation of a drift from the beginning of irradiation with the charged-particle beam.

6. The drift correction method according to claim 1, wherein the writing area is divided into stripes having a reference width and divided into a mesh shape with a predetermined size to form a plurality of small areas, an area density of the pattern is calculated for each of the small areas, a maximum value of the area density of the small area included in the stripe having the reference width is obtained, and the reference width is adjusted according to the maximum value.

7. The drift correction method according to claim 1, wherein the writing area is divided into stripes having a reference width and divided into a mesh shape with a predetermined size to form a plurality of small areas, an area density of the pattern is calculated for each of the small areas, a minimum value of the area density of the small area included in the stripe having the reference width is obtained, and the reference width is adjusted according to the minimum value.

8. A drift correction method comprising the steps of:
generating layout data from pattern data of a pattern to be written on a writing area on a sample;
dividing the layout data into stripes having a reference width and dividing the layout data into a mesh shape with a predetermined size to form a plurality of small areas, calculating an area density of the pattern for each of the small areas, and obtaining an average value of the area densities of the small areas included in the stripe having the reference width;
adjusting the reference width according to the average value; and
writing the pattern on the sample with a charged-particle beam in accordance with adjusted stripes,
wherein when the writing of at least one adjusted stripe is terminated, or during writing of one of the adjusted stripes, writing is stopped to measure a drift amount, and an irradiation position of the charged-particle beam is corrected using the drift amount.

9. The drift correction method according to claim 8, wherein in the step of writing the pattern with the charged-particle beam, the pattern is written while the charged-particle beam is deflected by a main deflector and a sub deflector arranged on an optical path of the charged-particle beam, and
a value of the reference width is more than zero and not more than a maximum value of a deflection width of the main deflector.

10. The drift correction method according to claim 8, wherein after the reference width is adjusted according to the average value of the area density, the width is further adjusted according to the variation of the area density of the pattern between the stripes.

11. The drift correction method according to claim 8, wherein the width of the adjusted stripe is a width corresponding to the variation of a drift from the beginning of irradiation with the charged-particle beam.

12. A drift correction method comprising the steps of:
generating layout data from pattern data of a pattern to be written on a writing area on a sample;
dividing the layout data into stripes having a reference width and dividing the layout data into a mesh shape with a predetermined size to form a plurality of small areas, calculating an area density of the pattern for each of the small areas, and obtaining a maximum value of the area densities of the small areas included in the stripe having the reference width;
adjusting the reference width according to the maximum value; and
writing the pattern on the sample with a charged-particle beam in accordance with adjusted stripes,
wherein when the writing of at least one adjusted stripe is terminated, or during the writing of one of the adjusted stripes, writing is stopped to measure a drift amount, and an irradiation position of the charged-particle beam is corrected using the drift amount.

13. A drift correction method comprising the steps of:
generating layout data from pattern data of a pattern to be written on a writing area on a sample;

dividing the layout data into stripes having a reference width and dividing the layout data into a mesh shape with a predetermined size to form a plurality of small areas, calculating an area density of the pattern for each of the small areas, and obtaining a minimum value of the area densities of the small areas included in the stripe having the reference width;

adjusting the reference width according to the minimum value; and writing the pattern on the sample with a charged-particle beam in accordance with adjusted stripes, wherein when the writing of at least one adjusted stripe is terminated, or during the writing of one of the adjusted stripes, writing is stopped to measure a drift amount, and an irradiation position of the charged-particle beam is corrected using the drift amount.

14. A pattern writing data generation method for writing a predetermined pattern on a sample with a charged-particle beam, wherein layout data in which the pattern is defined is divided into a plurality of stripes having a width corresponding to an area density of the pattern to create the pattern writing data.

15. The pattern writing data generation method according to claim 14, wherein the width of the stripe is a width corresponding to the variation of a drift from the beginning of irradiation with the charged-particle beam.

16. The pattern writing data generation method according to claim 14:

wherein dividing the layout data into stripes having a reference width and dividing the layout data into a mesh shape with a predetermined size to form a plurality of small areas, calculating an area density of the pattern for each of the small areas, and obtaining an average value of the area densities of the small areas included in the stripe having the reference width, and adjusting the reference width according to the average value.

17. The pattern writing data generation method according to claim 16, wherein when the average value of the area density is more than a predetermined value, a stripe has a width narrower than the reference width, and when the average value of the area density is less than the predetermined value, the stripe has a width wider than the reference width.

18. The pattern writing data generation method according to claim 16, wherein after the reference width is adjusted according to the average value of the area density, the width is further adjusted according to the variation of the area density of the pattern between the stripes.

* * * * *